(12) United States Patent
Baeck et al.

(10) Patent No.: US 8,947,951 B2
(45) Date of Patent: Feb. 3, 2015

(54) SEMICONDUCTOR MEMORY DEVICES

(71) Applicant: Samsung Electronics Co., Ltd, Suwon-si, Gyeonggi-do (KR)

(72) Inventors: Sang-Yeop Baeck, Hwaseong-si (KR); Jin-Sung Kim, Seoul (KR); Jang-Hwan Yoon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 29 days.

(21) Appl. No.: 13/836,902

(22) Filed: Mar. 15, 2013

(65) Prior Publication Data

US 2013/0343135 A1  Dec. 26, 2013

(30) Foreign Application Priority Data

Jun. 22, 2012 (KR) .................. 10-2012-0067090

(51) Int. Cl.
*G11C 7/00* (2006.01)
*G11C 7/12* (2006.01)

(52) U.S. Cl.
CPC ........................... *G11C 7/12* (2013.01)
USPC ..................... 365/189.11; 365/226

(58) Field of Classification Search
USPC ............................. 365/189.11, 226
See application file for complete search history.

(56) References Cited

U.S. PATENT DOCUMENTS

| | | | |
|---|---|---|---|
| 4,586,166 A | 4/1986 | Shah | |
| 5,726,945 A | 3/1998 | Ukita et al. | |
| 5,818,258 A | 10/1998 | Choi | |
| 5,877,988 A | 3/1999 | Shim et al. | |
| 6,049,476 A | 4/2000 | Laudon et al. | |
| 6,075,729 A | 6/2000 | Ohhata et al. | |
| 7,345,590 B2 | 3/2008 | Nakano et al. | |
| 7,426,136 B2* | 9/2008 | Sakurai et al. | 365/185.02 |
| 7,502,275 B2* | 3/2009 | Nii et al. | 365/226 |
| 7,570,525 B2* | 8/2009 | Nii et al. | 365/189.11 |
| 8,009,500 B2* | 8/2011 | Nii et al. | 365/226 |
| 2007/0030741 A1 | 2/2007 | Nii et al. | |
| 2009/0059705 A1 | 3/2009 | Wong | |
| 2009/0059706 A1 | 3/2009 | Wong | |
| 2009/0251984 A1 | 10/2009 | Jung et al. | |
| 2010/0309736 A1 | 12/2010 | Russell et al. | |
| 2011/0032750 A1 | 2/2011 | Yabuuchi et al. | |
| 2011/0075491 A1 | 3/2011 | Yun et al. | |

FOREIGN PATENT DOCUMENTS

| | | |
|---|---|---|
| JP | 07-057470 | 3/1995 |
| JP | 3581459 | 5/1997 |
| JP | 2006-011630 | 1/2006 |
| JP | 2007-066493 | 3/2007 |
| JP | 2007-242124 | 9/2007 |
| KR | 1998-0011462 | 4/1998 |
| KR | 2000-0041373 | 7/2000 |
| KR | 2008-0089072 | 10/2008 |

* cited by examiner

*Primary Examiner* — Michael Tran
(74) *Attorney, Agent, or Firm* — Ellsworth IP Group, PLLC

(57) ABSTRACT

A semiconductor memory device includes at least one memory cell connected to an internal voltage line that receives a cell power supply voltage and a write assist circuit connected to the internal voltage line. The write assist circuit lowers a level of the cell power supply voltage to a target level during a first period of a write operation on the memory cell and maintains the level of the cell power supply voltage at the target level during a second period of the write operation based on a write assist control signal. The second period succeeds the first period.

18 Claims, 13 Drawing Sheets

SEMICONDUCTOR MEMORY DEVICES

CROSS-REFERENCE TO RELATED APPLICATIONS

This U.S. non-provisional application claims the benefit of priority under 35 U.S.C. §119 to Korean Patent Application No. 2012-0067090 filed on Jun. 22, 2012 in the Korean Intellectual Property Office (KIPO), the entire content of which is incorporated herein by reference in its entirety.

BACKGROUND OF THE INVENTION

1. Field of the Invention

Exemplary embodiments relate to semiconductor memory devices. More particularly, exemplary embodiments relate to semiconductor memory devices having write assist circuits.

2. Description of the Related Art

Semiconductor memory devices are typically classified into volatile memory devices and nonvolatile memory devices. Volatile memory devices lose their stored data when their power supplies are interrupted, while nonvolatile memory devices retain their stored data even when their power supplies are interrupted.

Volatile memory devices include static random access memories (SRAMs) and dynamic random access memories (DRAMs), which are roughly categorized according to data storage schemes. That is, an SRAM stores data by using a latch while a DRAM stores data by using a capacitor. Comparatively, an SRAM is mainly used as a cache memory because its peripheral circuit is simple in configuration and its speed is high despite it having a lower memory capacity than a DRAM, due to its lower integration density.

The miniaturization of semiconductor devices is accelerating with the recent advance in semiconductor manufacturing processes, fueled by increases in the distribution of basic process characteristics of the semiconductor devices. For example, in an SRAM, miniaturization of semiconductor devices has improved due to increases in the distribution of characteristics required for design, such as a write margin and a sense margin. As semiconductor manufacturing processes become finer, the increased distribution leads to difficulties in the development of SRAMs and a reduction in the stability of memory cells. As a result, yield is reduced.

SUMMARY OF THE INVENTION

Some exemplary embodiments provide a semiconductor memory device capable of performing stable write operation.

Additional features and utilities of the present general inventive concept will be set forth in part in the description which follows and, in part, will be obvious from the description, or may be learned by practice of the general inventive concept.

According to exemplary embodiments, a semiconductor memory device includes at least one memory cell connected to an internal voltage line that receives a cell power supply voltage and a write assist circuit connected to the internal voltage line. The write assist circuit lowers a level of the cell power supply voltage to a target level during a first period of a write operation on the memory cell and maintains the level of the cell power supply voltage at the target level during a second period of the write operation based on a write assist control signal. The second period succeeds the first period.

In some embodiments, the first period may be shorter than the second period.

In some embodiments, the write assist circuit may include a first p-channel metal oxide semiconductor (PMOS) transistor, connected between the internal voltage line and a ground voltage, having a gate that receives the write assist control signal, the first PMOS transistor providing a first pull-down path between the internal voltage line and the ground voltage; an accelerator, connected between the internal voltage line and the ground voltage in parallel with the first PMOS transistor, the accelerator configured to be enabled during the first period, configured to be disabled and configured to provide a second pull-down path between the internal voltage line and the ground voltage in response to a pulse signal; and a pulse generator configured to generate the pulse signal based on the write assist control signal.

The accelerator may include a second PMOS transistor connected between the internal voltage line and the ground voltage, and the second PMOS transistor has a gate which receives the pulse signal. A current driving capability of the second PMOS transistor may be greater than a current driving capability of the first PMOS transistor.

The accelerator may include a n-channel metal oxide semiconductor (NMOS) transistor connected between the internal voltage line and the ground voltage, and the NMOS transistor has a gate which receives the pulse signal. A current driving capability of the NMOS transistor may be greater than a current driving capability of the first PMOS transistor.

The semiconductor memory device may further include a precharge circuit, connected between a power supply voltage and the internal voltage line, which precharges the internal voltage line.

The precharge circuit may include a second PMOS transistor connected between the power supply voltage and the internal voltage line and the second PMOS transistor has a gate connected to the ground voltage.

The first PMOS transistor and the accelerator may be turned on to lower the level of the cell power supply voltage to the target level during the first period and the first PMOS transistor may be turned on and the accelerator may be turned off such that the first and the second PMOS transistors maintain the level of the cell power supply voltage at the target level during the second period.

The first and second pull-down paths may be conducting such that the cell power supply voltage is lowered to the target level during the first period, and the first full-down path may be conducting and the second pull-down path may be not conducting such that the cell power supply voltage is maintained at the target level during the second period.

In some embodiments, the write assist circuit may include a first PMOS transistor, connected between the internal voltage line and a ground voltage, having a gate that receives the write assist control signal; a second PMOS transistor, connected to the internal voltage line, having a gate that receives the write assist control signal; an NMOS transistor, connected between the second PMOS transistor and a ground voltage, which is turned on during the first period and is turned off during the second period in response to a delayed pulse signal that having a delayed and inverted phase with respect to the write assist control signal; and a pulse generator that generates the delayed pulse signal in response to the write assist control signal.

The pulse generator may include odd-numbered inverters that are connected in series.

In some embodiments, the write assist circuit may include a first PMOS transistor, connected between the internal voltage line and a ground voltage, having a gate that receives the write assist control signal; a second PMOS transistor, connected to the internal voltage line, having a gate that receives the write assist control signal; a third PMOS transistor, connected between the second PMOS transistor and a ground voltage, which is turned on during the first period and is turned off during the second period in response to a delayed pulse signal that having a delayed and inverted phase with respect to the write assist control signal; and a pulse generator that generates the delayed pulse signal in response to the write assist control signal.

The pulse generator may include even-numbered inverters that are connected in series.

According to exemplary embodiments, a semiconductor memory device includes at least one memory cell connected to an internal voltage line that receives a cell power supply voltage and a write assist circuit connected to the internal voltage line. The write assist circuit lowers a level of the cell power supply voltage to a target level during a first period of a write operation on the memory cell and maintains the level of the cell power supply voltage at the target level during a second period of the write operation based on a write assist control signal and a delay control signal. The second period succeeds the first period.

In some embodiments, the write assist circuit may include a first pull-down unit which is turned on during the first and second periods in response to the write assist control signal to provide a first pull-down path from the internal voltage line to a ground voltage; and a second pull-down unit which is turned on during the first period and which is turned off during the second period in response to the delay control signal to provide a second pull-down path from the internal voltage line to the ground voltage.

The present general inventive concept also provides a memory card, comprising: a nonvolatile memory device; a semiconductor memory device, comprising: at least one memory cell connected to an internal voltage line that receives a cell power supply voltage; and a write assist circuit connected to the internal voltage line, the write assist circuit configured to lower a level of the cell power supply voltage to a target level during a first period of a write operation on the memory cell and configured to maintain the level of the cell power supply voltage at the target level during a second period of the write operation based on a write assist control signal; and a controller configured to receive data and control the nonvolatile memory device to store the received data, and configured to control the semiconductor memory device as a buffer to temporarily store the data to be stored in the nonvolatile memory device.

As described above, the semiconductor memory device lowers the cell power supply voltage of the internal voltage line connected to the memory cell to a target level during a first period and maintains the cell power supply voltage at the target level during a second period succeeding the first period.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
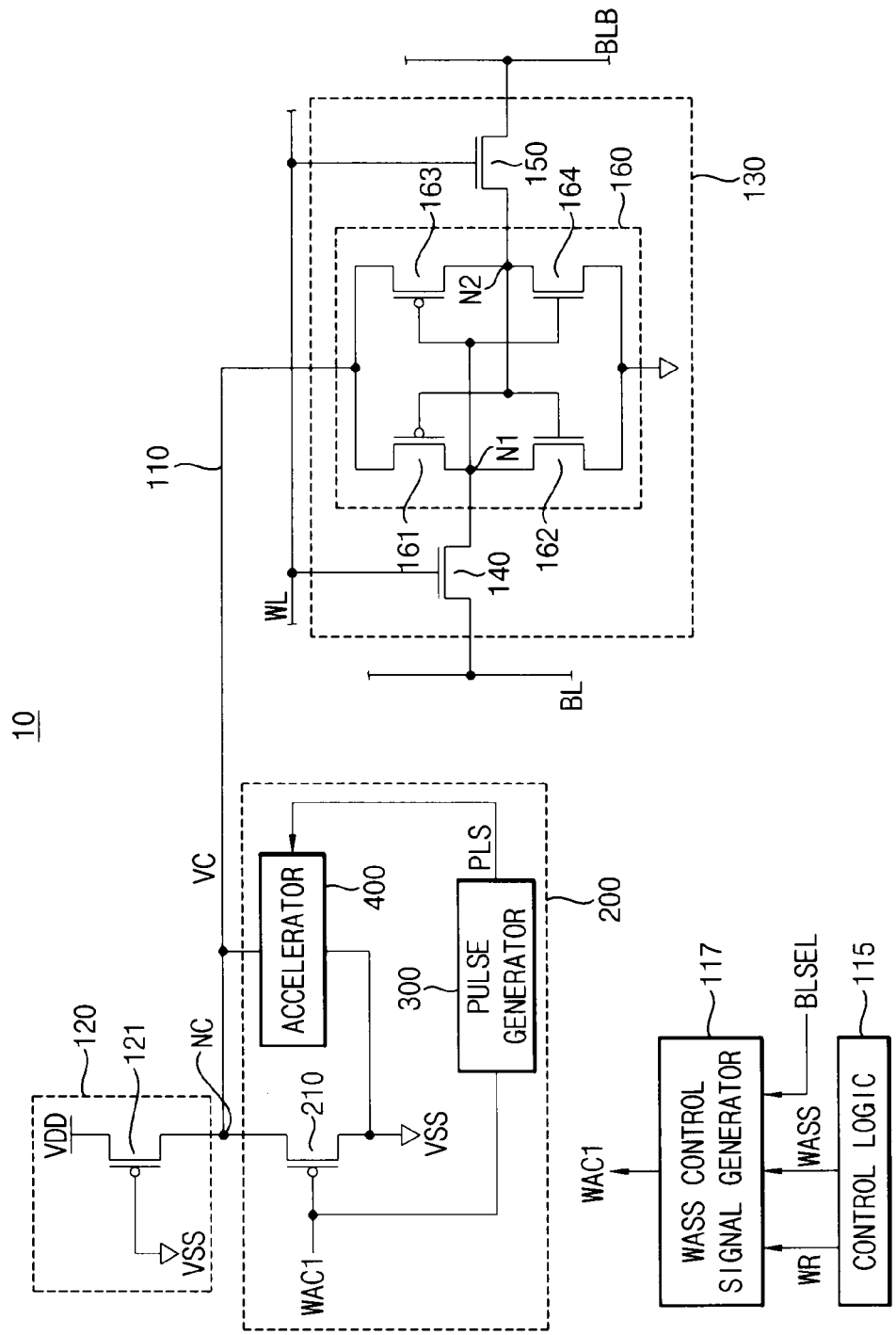
FIG. 1 is a block diagram illustrating a semiconductor memory device including a write assist circuit according to exemplary embodiments.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of circuits and diagrams illustrated herein but are to include deviations in shapes or format that result, for example, from manufacturing.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a semiconductor memory device including a write assist circuit according to exemplary embodiments.

Referring to FIG. 1, a semiconductor memory device 10 includes a precharge circuit 120, a write assist circuit 200, a write assist control signal generator 117, a control logic 115 and a memory cell 130.

The memory cell 130 is connected to a wordline WL, a pair of bitlines BL and BLB, and stores cell data. The memory cell 130 may include a first access transistor 140, a second access transistor 150, and a latch circuit 160. The first access transistor 140 may include a gate connected to the word line WL, and a first terminal connected to the bit line BL. The second access transistor 150 may include a gate connected to the word line WL, and a first terminal connected to the complementary bit line BLB. The latch circuit 160 for storing data may be connected between a second terminal of the first access transistor 140 and a second terminal of the second access transistor 150. The latch circuit 160 may include a first p-type metal oxide semiconductor (PMOS) transistor 161, a first n-type metal oxide semiconductor (NMOS) transistor 162, a second PMOS transistor 163, and a second NMOS transistor 164.

One terminal of the first PMOS transistor 161 may be connected to an internal voltage line 110. The first NMOS transistor 162 may include one terminal connected to the other terminal of the first PMOS transistor 161, the other terminal connected to a ground GND, and a gate connected to a gate of the first PMOS transistor 161 and the other terminal of the second access transistor 150. One terminal of the second PMOS transistor 163 may be connected to the internal voltage line 110. The second NMOS transistor 164 may include one terminal connected to the other terminal of the second PMOS transistor 163 and the other terminal of the second access transistor 150, the other terminal connected to the ground GND, and a gate connected to a gate of the second PMOS transistor 163 and the other terminal of the first access transistor 140. A first node N1 and a second node N2 of the memory cell 130 may correspond to stored data which are opposite to each other. The first access transistor 140 connects the bitline BL with the first node N1 when the wordline WL is high. The second access transistor 150 connects the complementary bit line BLB with the second node N2 when the wordline WL is high.

That is, the memory cell 130 may be a full-CMOS type SRAM cell including six transistors. However, the memory cell 130 may be, for example, a high load resistor (HLR) type or a thin film transistor (TFT) type SRAM cell according to devices constituting the PMOS transistors 161 and 163.

One technique to increase the write margin of the memory cell 130 is to decrease the current flowing through the PMOS transistors 161 and 163. The level of a cell power supply voltage VC at the internal voltage line 110 may control the amount of the current flowing through the PMOS transistors 161 and 163. When the level of the cell power supply voltage VC is decreased, the amount of the current flowing through the PMOS transistors 161 and 163 is also decreased. According to exemplary embodiments, the write assist circuit 200 lowers a level of the cell power supply voltage VC to a target level during a first period of a write operation on the memory cell 130 and maintains the level of the cell power supply voltage VC at the target level during a second period of the write operation such that the memory cell 130 operates stably during the write operation on the memory cell 130.

The precharge circuit 120 precharges the period voltage line 110 to the power supply voltage VDD. The precharge circuit 120 includes a PMOS transistor 121. The PMOS transistor 121 has a source connected to the power supply voltage VDD, a drain connected to the internal voltage line 110 at a connection node NC, and a gate connected to the ground voltage VSS. Therefore, the PMOS transistor 121 is always conducting.

The write assist circuit 200 includes a PMOS transistor 210, a pulse generator 300, and an accelerator 400. The PMOS transistor 210 has a source connected to the internal voltage line 110, a gate receiving a write assist control signal WAC1, and a drain connected to the ground voltage VSS. The PMOS transistor 210 provides a first pull-down path from the internal voltage line 110 to the ground voltage VSS in response to the write assist control signal WAC1. The accelerator 400 is connected between the internal voltage line 110 and the ground voltage VSS in parallel with the PMOS transistor 210. The accelerator 400 provides a second pull-down path from the internal voltage line 110 to the ground voltage VSS in response to a pulse signal PLS. The pulse generator 300 generates the pulse signal PLS to the accelerator 400 based on the write assist control signal WAC1.

When the write assist circuit 200 is disabled, for example during a read operation or a stand-by operation, the control logic 115 sets the write assist control signal WAC1 to logic high level. When the write assist control signal WAC1 transitions to logic high level, the PMOS transistor 210 is turned off to cut-off the first pull-down path and the accelerator 400 is disabled to cut-off the second pull-down path.

Although FIG. 1 illustrates the memory cell 130 connected to one pair of bitlines (BL and BLB) and the write assist circuit 200 connected to the memory cell 130, the semiconductor memory device 10 of FIG. 1 may include a plurality of memory cells 130 respectively connected to a plurality of bitline pairs and a plurality of write assist circuits 200 respectively included for each bitline pair.

The control logic 115 provides a write operation signal WR and a write assist operation signal WASS to the write assist control signal generator 117 such that the write assist circuit 200 is enabled only during the write operation. In addition, the write assist control signal generator 117 receives a bitline selection signal BLSEL according to a column address such that a write assist circuit connected to the selected memory cell on which the write operation is performed is enabled.

When the write operational signal WR, the write assist operation signal WASS, and the bitline selection signal BLSEL are all enabled, the write assist control signal generator 117 generates the write assist control signal WAC1 such that a corresponding write assist circuit is enabled. Therefore, the write assist circuit connected to the selected memory cell on which the write operation is performed is enabled and a write assist circuit connected to an unselected memory cell is disabled.

Figure 2:
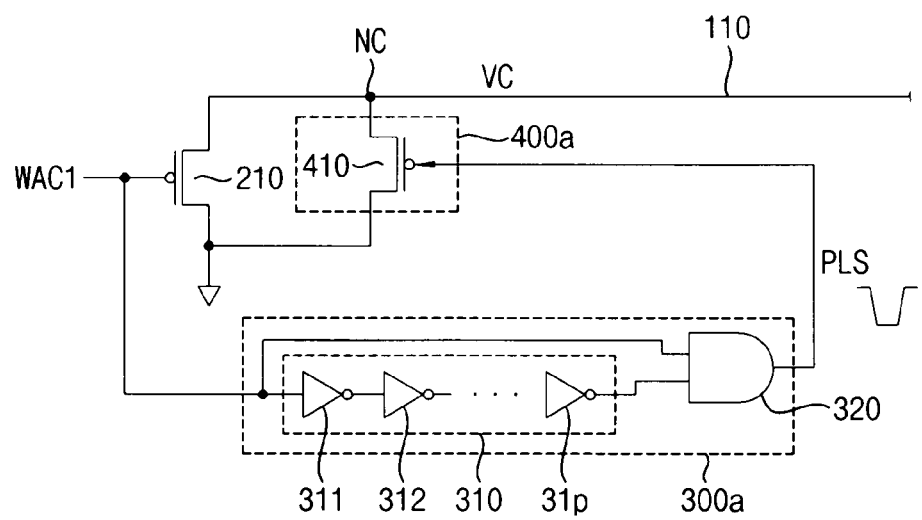
FIG. 2 is a circuit diagram illustrating an example of the write assist circuit in FIG. 1 according to exemplary embodiments.

FIG. 2 is a circuit diagram illustrating an example of the write assist circuit 200 in FIG. 1 according to exemplary embodiments.

Referring to FIG. 2, a write assist circuit 200a includes: a PMOS transistor 210 connected to the internal voltage line 110, an accelerator 400a connected between the internal voltage line 110 and the ground voltage in parallel with the PMOS transistor 210, and a pulse generator 300a. The accelerator 400a includes a PMOS transistor 410 which has a source connected to the internal voltage line 110, a gate receiving the pulse signal PLS, and a drain connected to the ground voltage. The pulse generator 300a includes a delay unit 310 which has a plurality of inverters (311~31p) connected in series and an AND gate 320.

The delay unit 310 receives the write assist control signal WAC1 and the AND gate 320 performs an AND operation on the write assist control signal WAC1 and an output of the delay unit 310 to output the pulse signal PLS. The pulse signal PLS, which is low, is applied to the gate of the PMOS transistor 410. The PMOS transistor 210 is turned on in response to the write assist control signal WAC1 to provide a first pull-down path from the internal voltage line 110 to the ground voltage, and the PMOS transistor 410 is turned on in response to the pulse signal PLS to provide a second pull-down path from the internal voltage line 110 to the ground voltage. By controlling the times of turning on the PMOS transistors 210 and 410, the cell power supply voltage VC is lowered rapidly to the target level and the cell power supply voltage VC is maintained at the target level. A write operation may then be performed stably. The current driving capability of the PMOS transistor 210 may be smaller than the current driving capability of the PMOS transistor 410. That is, a ratio of channel length to a channel width of the PMOS transistor 410 may be greater than a ratio of channel length to a channel width of the PMOS transistor 210. When constructed accordingly, an amount of current flowing through the first pull-down path to the ground voltage is smaller than an amount of current flowing through the second pull-down path to the ground voltage.

Figure 3:
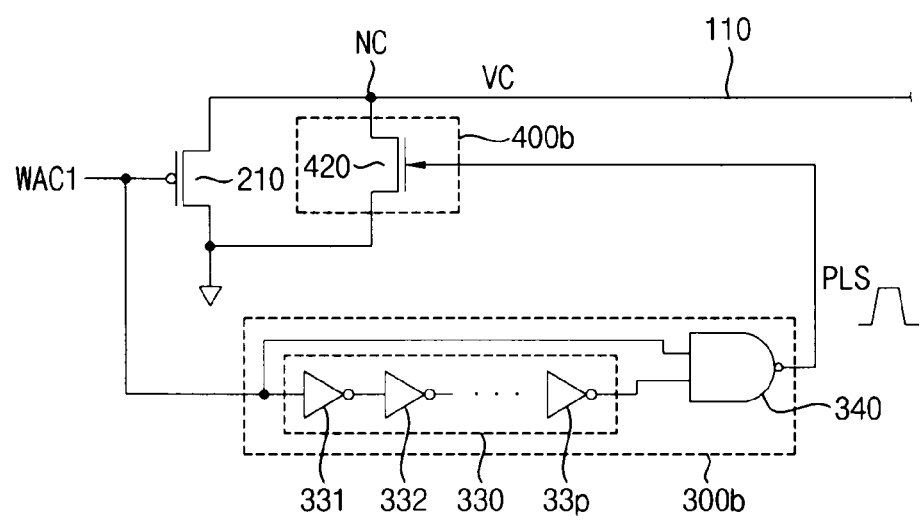
FIG. 3 is a circuit diagram illustrating another example of the write assist circuit in FIG. 1 according to exemplary embodiments.

FIG. 3 is a circuit diagram illustrating another example of the write assist circuit in FIG. 1 according to exemplary embodiments.

Referring to FIG. 3, a write assist circuit 200b includes: a PMOS transistor 210 connected to the internal voltage line 110, an accelerator 400b connected between the internal voltage line 110 and the ground voltage in parallel with the PMOS transistor 210, and a pulse generator 300b. The accelerator 400b includes an NMOS transistor 420, which has a drain connected to the internal voltage line 110, a gate receiving the pulse signal PLS, and a source connected to the ground voltage. The pulse generator 300b includes a delay unit 330, which has a plurality of inverters (331~33p) connected in series, and a NAND gate 340.

The delay unit 330 receives the write assist control signal WAC1, and the NAND gate 340 performs a NAND operation on the write assist control signal WAC1 and an output of the delay unit 330 to output the pulse signal PLS. The pulse signal PLS, which is high, is applied to the gate of the NMOS transistor 420. The PMOS transistor 210 is turned on in response to the write assist control signal WAC1 to provide a first pull-down path from the internal voltage line 110 to the ground voltage, and the NMOS transistor 420 is turned on in response to the pulse signal PLS to provide a second pull-down path from the internal voltage line 110 to the ground voltage. By controlling the times of turning on the PMOS transistor 210 and the NMOS transistor 420, the cell power supply voltage VC is lowered rapidly to the target level and the cell power supply voltage VC is maintained at the target level. A write operation may then be performed stably. Current driving capability of the PMOS transistor 210 may be smaller than current driving capability of the NMOS transistor 420. When constructed accordingly, an amount of current flowing through the first pull-down path to the ground voltage is smaller than an amount of current flowing through the second pull-down path to the ground voltage.

Figure 4:
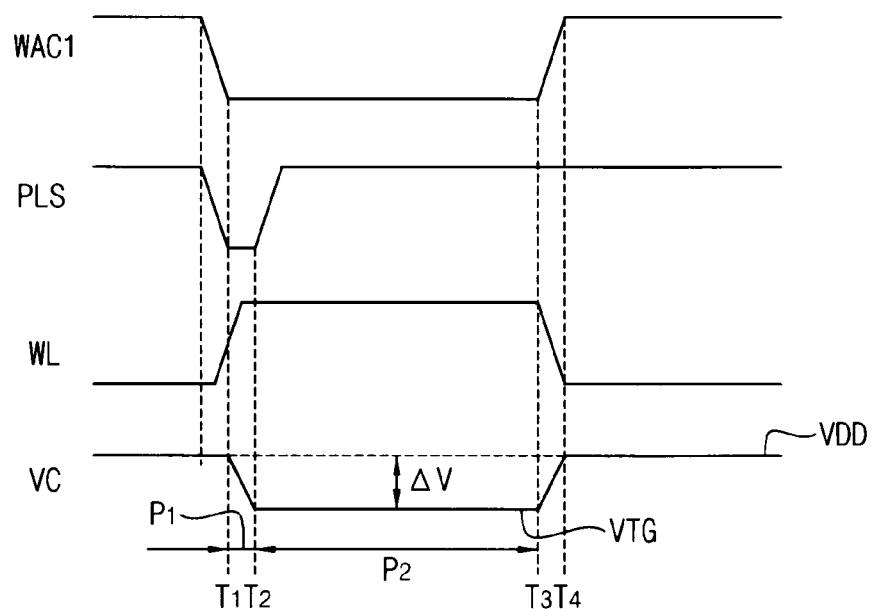
FIG. 4 is a timing diagram illustrating an operation of the write assist circuit of FIG. 2.

FIG. 4 is a timing diagram illustrating an operation of the write assist circuit of FIG. 2.

Referring to FIGS. 1, 2 and 4, at time T1, when the write assist signal WAC1 and the pulse signal PLS is low, the PMOS transistors 210 and 410 are turned on and the cell power supply voltage VC is discharged through the first and second pull-down paths. The pulse signal PLS is low during a period P1 from time T1 to time T2. During the period P1, the cell power supply voltage VC is lowered from the power supply voltage VDD to a target level VTG by ΔV. After time T2, when the pulse signal PLS is high, the PMOS transistor 410 is turned off to cut off the second pull-down path. The write assist control signal WAC1 is maintained at low level during a period P2 to time T3, and transitions to high level at time T4. Therefore, since the PMOS transistor 210 is turned on during the period P2, the first pull-down path is conducting during the period P2. A wordline is enabled at time T1 and is maintained at an enabled state until time T3. The period P1 may be shorter than the period P2. The target level VTG may be determined according to a delaying amount of the delay unit 310 and the driving capability of the PMOS transistor 410 included in the accelerator 400a. As described with reference to FIG. 2, since the current driving capability of the PMOS transistor 210 may be smaller than the current driving capability of the PMOS transistor 410, the PMOS transistors 210 and 410 are turned on during the period P1 such that the cell power supply voltage VC is rapidly lowered to the target level VTG. The PMOS transistor 210 is turned on and the PMOS transistor 410 is turned off during the period P2 such that the cell power supply voltage VC is maintained at the target level VTG. Therefore, the write operation is stably performed on the memory cell 130 because the cell power supply voltage VC having the target level VTG is provided to the memory cell 130 during the period P2.

Figure 5:
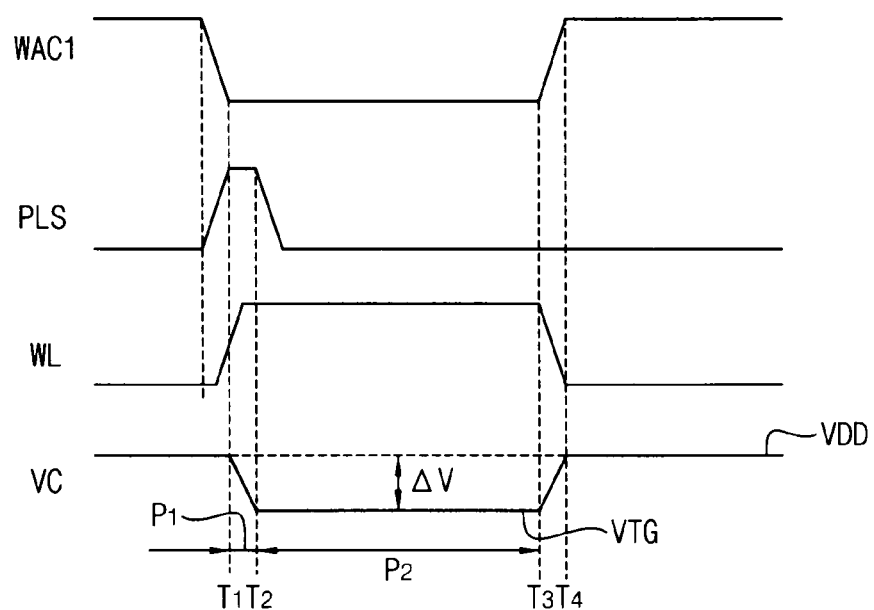
FIG. 5 is a timing diagram illustrating an operation of the write assist circuit of FIG. 3.

FIG. 5 is a timing diagram illustrating an operation of the write assist circuit of FIG. 3.

Referring to FIGS. 1, 3 and 5, at time T1, the write assist signal WAC1 is low and the pulse signal PLS is high. The PMOS transistor 210 and the NMOS transistor 420 are accordingly turned on and the cell power supply voltage VC is discharged through the first and second pull-down paths. The pulse signal PLS is high during a period P1 from time T1 to time T2. During the period P1, the cell power supply voltage VC is lowered from the power supply voltage VDD to a target level VTG by ΔV. After time T2, when the pulse signal PLS is low, the NMOS transistor 420 is turned off to cut off the second pull-down path. The write assist control signal WAC1 is maintained at low during a period P2 to time T3 and transitions to high at time T4. Therefore, since the PMOS transistor 210 is turned on during the period P2, the first pull-down path is conducting during the period P2. A wordline is enabled at time T1 and is maintained at enabled state until time T3. The period P1 may be shorter than the period P2. The target level VTG may be determined according to a delaying amount of the delay unit 330 and the driving capability of the NMOS transistor 420 included in the accelerator 400b. As described with reference to FIG. 3, since the current driving capability of the PMOS transistor 210 may be smaller than the current driving capability of the NMOS transistor 420, the PMOS transistor 210 and the NMOS transistor 420 may be turned on during the period P1 such that the cell power supply voltage VC is rapidly lowered to the target level VTG. The PMOS transistor 210 is turned on and the MMOS transistor 420 is turned off during the period P2 such that the cell power supply voltage VC is maintained at the target level VTG. Therefore, the write operation is stably performed on the memory cell 130 because the cell power supply voltage VC, having the target level VTG, is provided to the memory cell 130 during the period P2.

Figure 6:
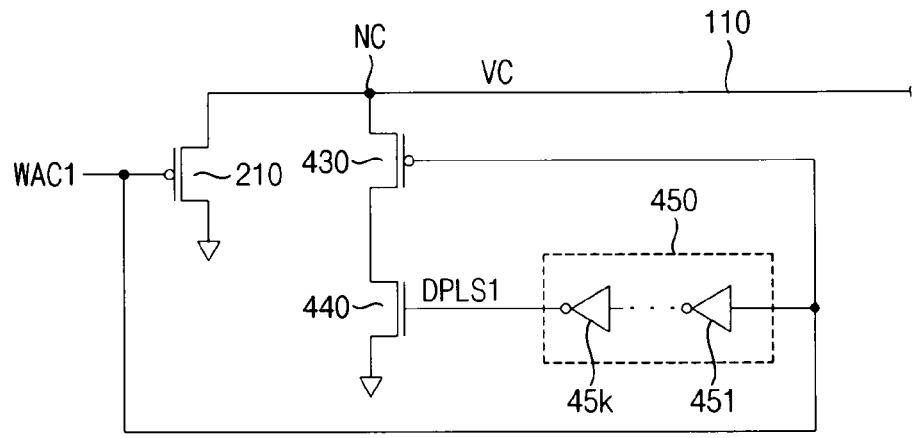
FIG. 6 is a circuit diagram illustrating still another example of the write assist circuit in FIG. 1 according to exemplary embodiments.

FIG. 6 is a circuit diagram illustrating still another example of the write assist circuit 200 in FIG. 1 according to exemplary embodiments.

Referring to FIG. 6, a write assist circuit 200c includes: a PMOS transistor 210 connected to the internal voltage line 110, a PMOS transistor 430 and an NMOS transistor 440 connected between the internal voltage line 110 and the ground voltage in parallel with the PMOS transistor 210, and a pulse generator 450. The PMOS transistor 430 has a source connected to the internal voltage line 110 at the connection node NC, a gate receiving the write assist control signal WAC1 and a drain connected to the NMOS transistor 440. The NMOS transistor 440 is connected between the PMOS transistor 430 and the ground voltage and has a gate receiving a first delayed pulse signal DPLS1. The first delayed pulse signal DPLS1 has a phase which is delayed and inverted with respect to the write assist control signal WAC1. The pulse generator 450 includes an odd number of inverters (451~45k) connected in series. The pulse generator 450 receives the assist control signal WAC1 to provide the first delayed pulse signal DPLS1 to the gate of the NMOS transistor 440. Therefore, the NMOS transistor 440 is turned on with a delay amount by which the first delayed pulse signal DPLS1 is delayed with respect to the write assist control signal WAC1. Accordingly, the second pull-down path is conducting by the delay amount with respect to the first pull-down path. As described with reference to FIG. 3, the current driving capability of the PMOS transistor 430 and the NMOS transistor 440 may be greater than the PMOS transistor 210. Therefore, an amount of current flowing through the first pull-down path to the ground voltage may be smaller than an amount of current flowing through the second pull-down path to the ground voltage.

The PMOS transistor 210 is turned on in response to the write assist control signal WAC1 to provide the first pull-down path from the internal voltage line 110 to the ground voltage and the PMOS transistor 430 and the NMOS transistor 440 are turned on in response to the write assist control signal WAC1 and the first delayed pulse signal DPLS1 to provide the second pull-down path from the internal voltage line 110 to the ground voltage. The second pull-down path conducts when both the PMOS transistor 430 and the NMOS transistor 440 are turned on. As described with reference to FIG. 5, the cell power supply voltage VC is then rapidly discharged to the target level VTG through the first and second pull-down paths during the period P1. Further, the cell power supply voltage VC is maintained at the target level VTG during the period P2 because the NMOS transistor 440 is turned off during the period P2. Therefore, the write operation is stably performed on the memory cell 130 because the cell power supply voltage VC having the target level VTG is provided to the memory cell 130 during the period P2.

Figure 7:
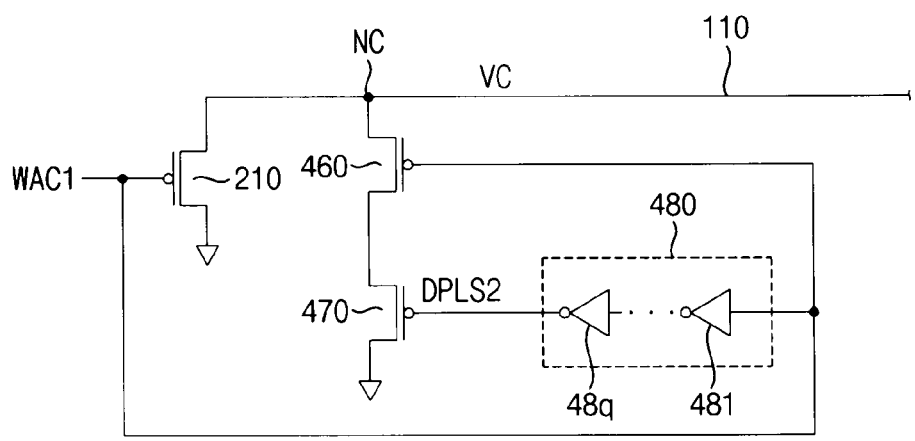
FIG. 7 is a circuit diagram illustrating still another example of the write assist circuit in FIG. 1 according to exemplary embodiments.

FIG. 7 is a circuit diagram illustrating still another example of the write assist circuit 200 in FIG. 1 according to exemplary embodiments.

Referring to FIG. 7, a write assist circuit 200d includes: a PMOS transistor 210 connected to the internal voltage line 110, a PMOS transistor 460 and a PMOS transistor 470 connected between the internal voltage line 110 and the ground voltage in parallel with the PMOS transistor 210, and a pulse generator 480. The PMOS transistor 460 has a source connected to the internal voltage line 110 at the connection node NC, a gate receiving the write assist control signal WAC1 and a drain connected to the PMOS transistor 470. The PMOS transistor is connected between the PMOS transistor 460 and the ground voltage and has a gate receiving a second delayed pulse signal DPLS2. The second delayed pulse signal DPLS2 has a phase which is delayed with respect to the write assist control signal WAC1. The pulse generator 480 includes an even number of inverters (481~48q) connected in series. The pulse generator 480 receives the assist control signal WAC1 to provide the second delayed pulse signal DPLS2 to the gate of the PMOS transistor 440. Therefore, the PMOS transistor 470 is turned on with a delay amount by which the second delayed pulse signal DPLS2 is delayed with respect to the write assist control signal WAC1. Accordingly, the second pull-down path is conducting by the delay amount with respect to the first pull-down path. As described with reference to FIG. 2, the current driving capability of the PMOS transistor 460 and the PMOS transistor 470 may be greater than the PMOS transistor 210. Therefore, an amount of current flowing through the first pull-down path to the ground voltage may be smaller than an amount of current flowing through the second pull-down path to the ground voltage.

The PMOS transistor 210 is turned on in response to the write assist control signal WAC1 to provide the first pull-down path from the internal voltage line 110 to the ground voltage. The PMOS transistors 460 and 470 are turned on in response to the write assist control signal WAC1 and the second delayed pulse signal DPLS2 to provide the second pull-down path from the internal voltage line 110 to the ground voltage. The second pull-down path conducts when both of the PMOS transistors 460 and 470 are turned on. Then, as described with reference to FIG. 4, the cell power supply voltage VC is rapidly discharged to the target level VTG through the first and second pull-down paths during the period P1. The cell power supply voltage VC is maintained at the target level VTG during the period P2 because the PMOS transistor 470 is turned off during the period P2. Therefore, the write operation is stably performed on the memory cell 130 because the cell power supply voltage VC having the target level VTG is provided to the memory cell 130 during the period P2.

Figure 8:
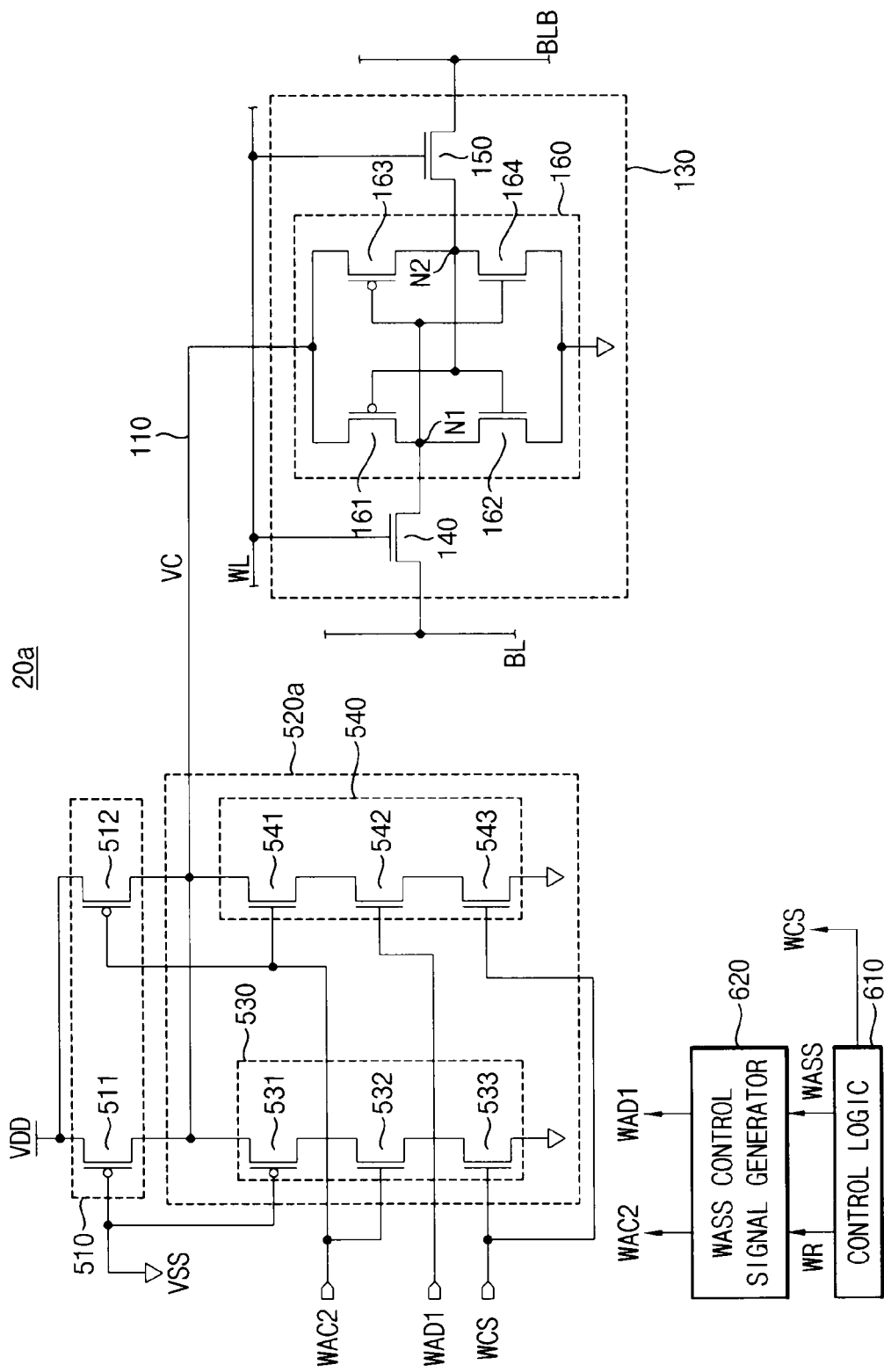
FIGS. 8 to 10 are block diagrams illustrating respectively a semiconductor memory device including a write assist circuit according to exemplary embodiments.
Figure 9:
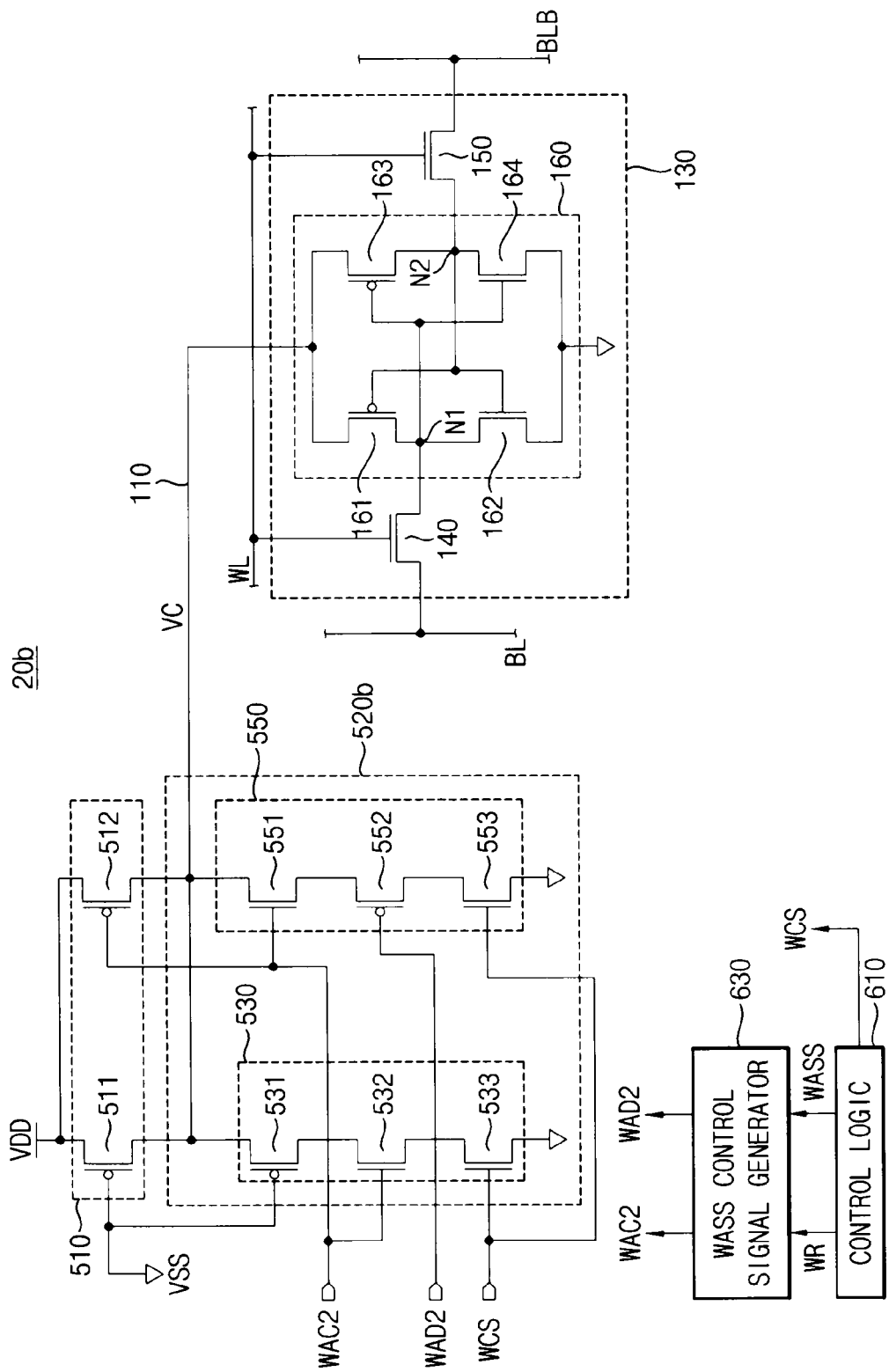
Figure 10:
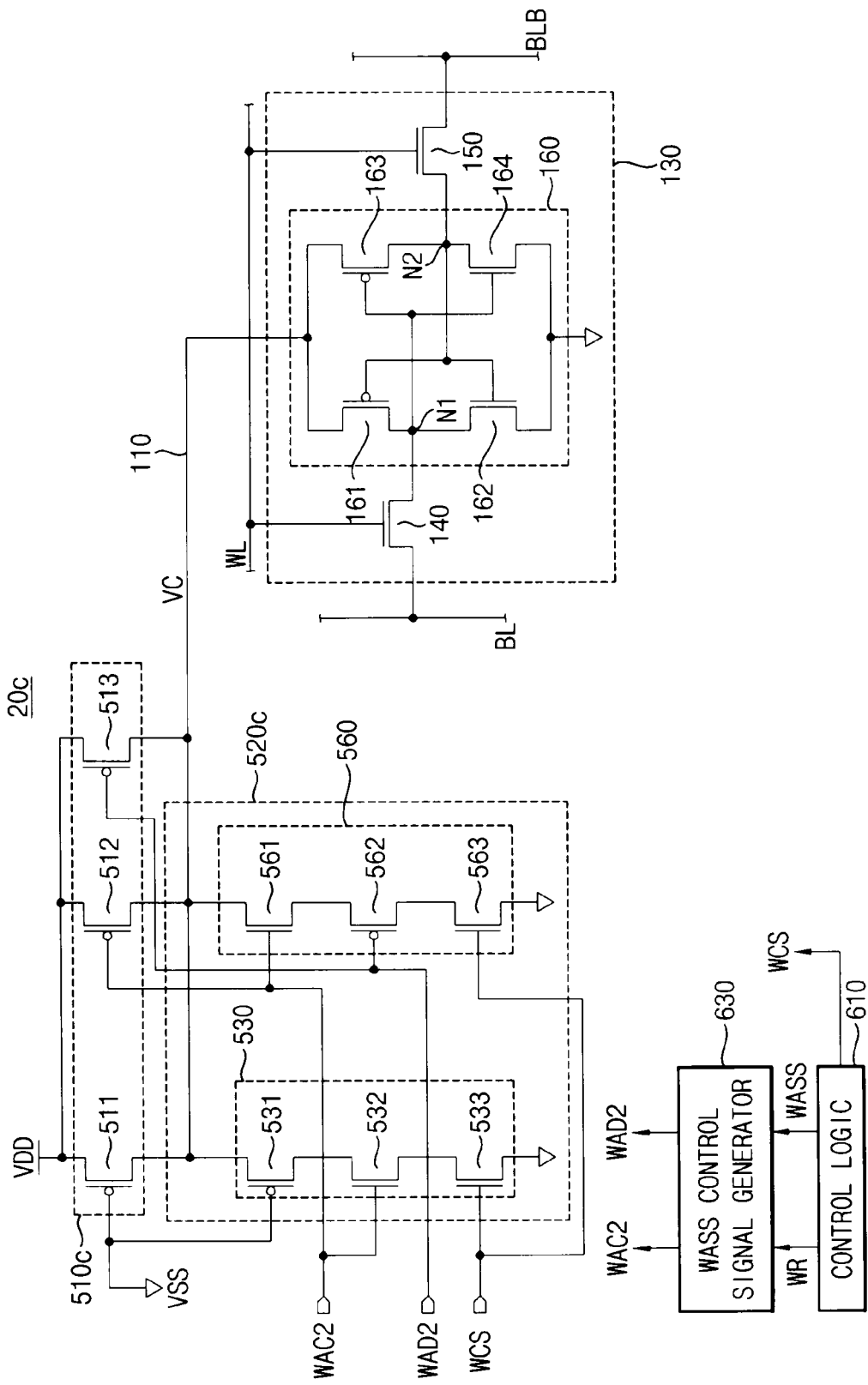

FIGS. 8 to 10 are block diagrams illustrating respectively a semiconductor memory device including a write assist circuit according to exemplary embodiments.

In FIGS. 8 to 10, since the memory cell 130 in FIG. 1 is employed, detailed description on the memory cell 130 will be omitted.

Referring to FIG. 8, a semiconductor memory device 20*a* includes a precharge circuit 510, a write assist circuit 520*a*, a write assist control signal generator 620, a control logic 610 and the memory cell 130.

The precharge circuit 510 precharges the period voltage line 110 to the power supply voltage VDD. The precharge circuit 510 includes PMOS transistors 511 and 512. The PMOS transistor 511 has a source connected to the power supply voltage VDD, a drain connected to the internal voltage line 110 and a gate connected to the ground voltage VSS. Therefore, the PMOS transistor 511 is always conducting. The PMOS transistor 512 has a source connected to the power supply voltage VDD, a drain connected to the internal voltage line 110 and a gate receiving the write assist control signal WAC2. The PMOS transistor 512 is turned off when the write assist control signal WAC2 is high and the PMOS transistor 512 is turned on to precharge the internal voltage line 110 when the write assist control signal WAC2 is low.

The write assist circuit 520*a* includes first and second pull-down units 530 and 540. The first pull-down path 530 includes a PMOS transistor 531 and NMOS transistors 532 and 533 which are cascode-connected between the internal voltage line 110 and the ground voltage. The PMOS transistor 531 is connected between the internal voltage line 110 and the NMOS transistor 532 and has a gate connected to the ground voltage. The PMOS transistor 531 is always turned on. The NMOS transistor 532 is connected between the PMOS transistor 531 and the NMOS transistor 533 and has a gate receiving the write assist control signal WAC2. The NMOS transistor 533 is connected between the NMOS transistor 532 and the ground voltage and has a gate receiving a column selection signal WCS. The second pull-down unit 540 includes NMOS transistors 541, 542 and 543, which are cascode-connected between the internal voltage line 110 and the ground voltage. The NMOS transistor 541 is connected between the internal voltage line 110 and the NMOS transistor 542 and has a gate receiving the write assist control signal WAC2. The NMOS transistor 542 is connected between the NMOS transistors 541 and 543 and has a gate receiving a delay control signal WAD1. The NMOS transistor 543 is connected between the NMOS transistor 542 and the ground voltage and has a gate receiving the column selection signal WCS. The column selection signal WCS is enabled when the write operation is performed on the memory cell 110. Current driving capability of the transistors 531, 532 and 533 in the first pull-down unit 530 may be smaller than current driving capability of the transistors 541, 542 and 543 in the second pull-down unit 540. Therefore, the amount of current flowing through the first pull-down path to the ground may be smaller than the amount of current flowing through the second pull-down path to the ground.

The first pull-down unit 530 provides the first pull-down path from the internal voltage line 110 to the ground voltage in response to the write assist control signal WAC2 and the second pull-down unit 540 provides the second pull-down path from the internal voltage line 110 to the ground voltage in response to the write assist control signal WAC2 and the delay control signal WAD1. The delay control signal WAD1 has a phase which is delayed and inverted with respect to the write assist control signal WAC2. Therefore, the first period during which the write assist control signal WAC2 and the delay control signal WAD1 are high is shorter than the second period during which the write assist control signal WAC2 is high. Therefore, the cell power supply voltage VC is lowered to the target level through the first and second pull-down units 530 and 540 during the first period. The power supply voltage VC is maintained at the target level through the first pull-down unit 530 during the second period.

The control logic 610 provides a write operation signal WR and a write assist operation signal WASS to the write assist control signal generator 620 such that the write assist circuit 520*a* is enabled only during the write operation. In addition, the write assist control signal generator 520*a* receives the column selection signal WCS such that a write assist circuit connected to the selected memory cell on which the write operation is performed is enabled.

When the write operational signal WR and the write assist operation signal WASS are enabled, the write assist control signal generator 620 generates the write assist control signal WAC2 and the delay control signal WAD1 such that corresponding write assist circuit is enabled. Therefore, the write assist circuit connected to the selected memory cell on which the write operation is performed is enabled and a write assist circuit connected to an unselected memory cell is disabled.

Referring to FIG. 9, a semiconductor memory device 20*b* includes a precharge circuit 510, a write assist circuit 520*b*, a write assist control signal generator 630, a control logic 610 and the memory cell 130.

The semiconductor memory device 20*b* of FIG. 9 differs from the semiconductor memory device 20*a* of FIG. 8 in a second full-down unit 550 in the write assist circuit 520*b*.

The second full-down unit 550 includes a NMOS transistor 551, a PMOS transistor 552 and a NMOS transistor 553 which are cascode-connected between the internal voltage line 110 and the ground voltage. The NMOS transistor 551 is connected between the internal voltage line 110 and the PMOS transistor 552 and has a gate receiving the write assist control signal WAC2. The PMOS transistor 552 is connected between the NMOS transistors 551 and 553 and has a gate receiving a delay control signal WAD2. The NMOS transistor 553 is connected between the PMOS transistor 552 and the ground voltage and has a gate receiving the column selection signal WCS. The column selection signal WCS is enabled when the write operation is performed on the memory cell 110. Current driving capability of the transistors 531, 532 and 533 in the first pull-down unit 530 may be smaller than current driving capability of the transistors 551, 552 and 553 in the second pull-down unit 550. Therefore, the amount of current flowing through the first pull-down path to the ground may be smaller than the amount of current flowing through the second pull-down path to the ground.

The first pull-down unit 530 provides the first pull-down path from the internal voltage line 110 to the ground voltage in response to the write assist control signal WAC2 and the second pull-down unit 550 provides the second pull-down path from the internal voltage line 110 to the ground voltage in response to the write assist control signal WAC2 and the delay control signal WAD2. The delay control signal WAD2 has a phase which is delayed and inverted with respect to the write assist control signal WAC2. Therefore, the first period during which the write assist control signal WAC2 and the delay control signal WAD2 are high is shorter than the second period during which the write assist control signal WAC2 is high. Therefore, the cell power supply voltage VC is lowered to the target level through the first and second pull-down units 530 and 550 during the first period. The power supply voltage VC is maintained at the target level through the first pull-down unit 530 during the second period.

The control logic 610 provides a write operation signal WR and a write assist operation signal WASS to the write assist control signal generator 630 such that the write assist circuit 520a is enabled only during the write operation. In addition, the write assist circuit 520a receives the column selection signal WCS such that a write assist circuit connected to the selected memory cell on which the write operation is performed is enabled.

When the write operational signal WR and the write assist operation signal WASS are enabled, the write assist control signal generator 630 generates the write assist control signal WAC2 and the delay control signal WAD2 such that a corresponding write assist circuit is enabled. Therefore, the write assist circuit connected to the selected memory cell on which the write operation is performed is enabled and a write assist circuit connected to an unselected memory cell is disabled.

Referring to FIG. 10, a semiconductor memory device 20c includes a precharge circuit 510c, a write assist circuit 520c, a write assist control signal generator 630, a control logic 610 and the memory cell 130.

The semiconductor memory device 20c of FIG. 10 differs from the semiconductor memory device 20b of FIG. 9 in the precharge circuit 510c.

The precharge circuit 510c includes PMOS transistors 511, 512 and 513 connected in parallel between the power supply voltage VDD and the internal voltage line 110.

The PMOS transistor 511 has a gate connected to the ground voltage VSS, the PMOS transistor 512 has a gate receiving the write assist control signal WAC2 that is high, and the PMOS transistor 513 has a gate receiving the delay control signal WAD2. The PMOS transistor 513 maintains the cell power supply voltage VC at the target level without respect to variance of the delay amount of the delay control signal WAD2.

Figure 11:
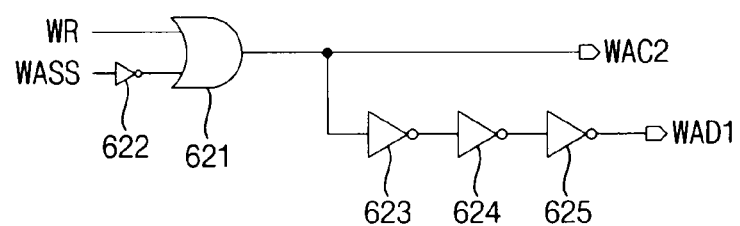
FIG. 11 is a circuit diagram illustrating an example of the write assist control signal generator in FIG. 8 according to exemplary embodiments.

FIG. 11 is a circuit diagram illustrating an example of the write assist control signal generator in FIG. 8 according to exemplary embodiments.

Figure 12:
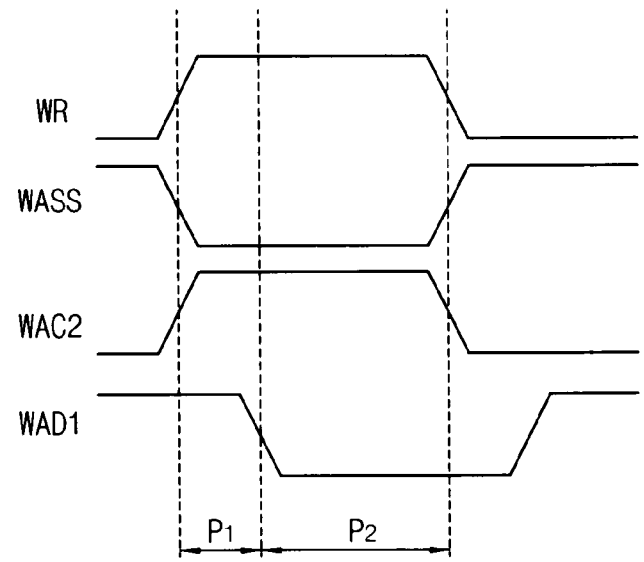
FIG. 12 is a timing diagram illustrating operation of the write assist control signal generator of FIG. 11.

FIG. 12 is a timing diagram illustrating operation of the write assist control signal generator of FIG. 11.

Referring to FIG. 11, the write assist control signal generator 620 includes an OR gate 621 and a plurality of inverters (622~625).

The inverter 622 inverts the write assist operation signal WASS. The OR gate 621 performs an OR operation on an output of the inverter 622 and the write operation signal WR to provide the write assist control signal WAC2. The inverters (623~625) are connected in series to delay and invert the write assist control signal WAC2 and thereby provide the delay control signal WAD1. Therefore, as illustrated in FIG. 12, the write assist control signal WAC2 and the delay control signal WAD1 are high during the first period P1 and only the write assist control signal WAC2 is high during the second period P2. The first period P1 may be shorter than the second period P2. The NMOS transistor 532 is turned on in response to the write assist control signal WAC2 and the NMOS transistor 542 is turned on in response to the delay control signal WAD1 during the first period P1. Therefore, the cell power supply voltage VC is lowered rapidly to the target level through the first and second pull-down units 530 and 540 during the first period P1. The NMOS transistor 532 is turned on in response to the write assist control signal WAC2 and the NMOS transistor 542 is turned off in response to the delay control signal WAD1 during the second period P2. Therefore, the power supply voltage VC is maintained at the target level through the first pull-down unit 530 during the second period P2. The write operation may therefore be stably performed on the memory cell 130.

Figure 13:
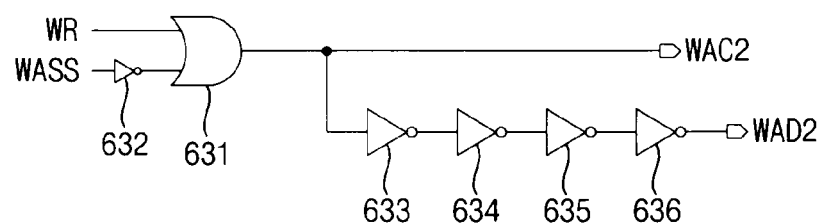
FIG. 13 is a circuit diagram illustrating an example of the write assist control signal generator in FIG. 9 according to exemplary embodiments.

FIG. 13 is a circuit diagram illustrating an example of the write assist control signal generator in FIG. 9 according to exemplary embodiments.

Figure 14:
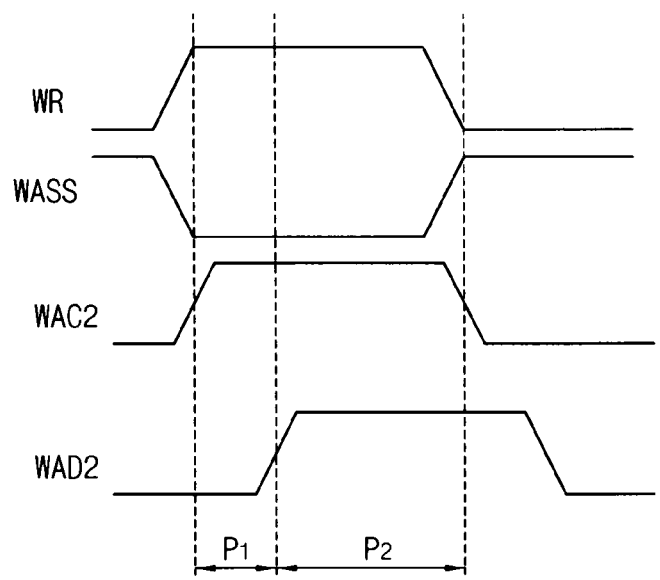
FIG. 14 is a timing diagram illustrating operation of the write assist control signal generator of FIG. 13.

FIG. 14 is a timing diagram illustrating operation of the write assist control signal generator of FIG. 13.

Referring to FIG. 13, the write assist control signal generator 630 includes an OR gate 631 and a plurality of inverters (632~636).

The inverter 632 inverts the write assist operation signal WASS. The OR gate 631 performs an OR operation on an output of the inverter 632 and the write operation signal WR to provide the write assist control signal WAC2. The inverters (633~636) are connected in series and the inverters (623~625) delays the write assist control signal WAC2 to provide the delay control signal WAD2. Therefore, as illustrated in FIG. 14, only the write assist control signal WAC2 is high during the first period P1 and the write assist control signal WAC2 and the delay control signal are high during the second period P2. The first period P1 may be shorter than the second period P2. The NMOS transistor 532 is turned on in response to the write assist control signal WAC2 and the PMOS transistor 552 is turned on in response to the delay control signal WAD2 during the first period P1. Therefore, the cell power supply voltage VC is lowered rapidly to the target level through the first and second pull-down units 530 and 550 during the first period P1. The NMOS transistor 532 is turned on in response to the write assist control signal WAC2 and the PMOS transistor 552 is turned off in response to the delay control signal WAD2 during the second period P2. Therefore, the power supply voltage VC is maintained at the target level through the first pull-down unit 530 during the second period P2. The write operation may therefore be stably performed on the memory cell 130.

Figure 15:
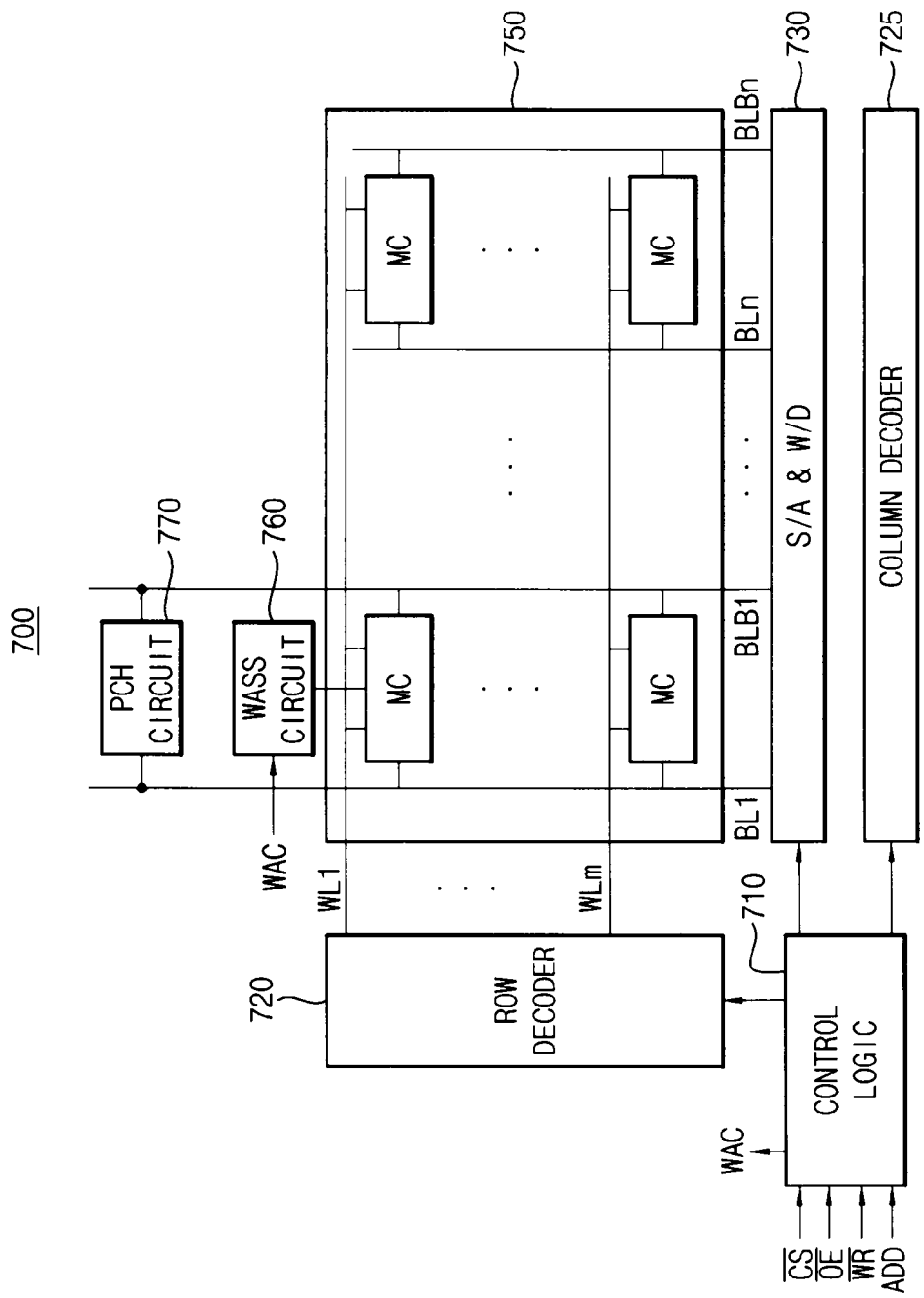
FIG. 15 is a block diagram illustrating a semiconductor memory device including the write assist circuit according to exemplary embodiments.

FIG. 15 is a block diagram illustrating a semiconductor memory device including the write assist circuit according to exemplary embodiments.

Referring to FIG. 15, a semiconductor memory device 700 includes: a control logic 710, a row decoder 720, a column decoder 725, a sense amplifier and write driver 730, a memory cell array 750, a write assist circuit 760 and a bitline precharge circuit 770.

The control logic 710 controls an overall operation of the semiconductor memory device 700 in response to control signals /CS, /OE, and /WE and an address ADD of an external device (e.g., a host, a memory controller or a memory interface). For example, the control logic 710 controls read and write operations of the semiconductor memory device 700. Moreover, the control logic 710 controls the write assist circuit 760 to be activated during the write operation.

The row decoder 720 selects one of a plurality of wordlines (WL1~WLm) in response to a row address. The column decoder 725 selects one of a plurality of bitline pairs (BL1~BLn) and (BLB1~BLBn) in response to a column address. The sense amplifier and write driver 730 outputs and receives data through a data input/output buffer (not shown). The sense amplifier 730 amplifies a difference in voltage between bitlines connected to a selected one of a plurality of memory cells to read data stored in the selected memory cell. The read data is output to an external entity of the semiconductor memory device 700 through the data input/output buffer. The write driver 730 programs data input to the selected memory cell through the data input/output buffer. Operation of the sense amplifier and write driver 730 is performed according to the control of the control logic 710.

The memory cell array 750 includes a plurality of cells for storing data. The memory cells are connected to each of the wordlines (WL1~WLm) and are each coupled between the bitlines (BL1~BLn) and the bitlines (BLB1~BLBn).

During a write operation, the write assist circuit 760 is activated according to a control signal WAC of the control logic 710 to decrease a power supply voltage level of a memory cell. That is, the write assist circuit 760 lowers the cell power supply voltage of the internal voltage line connected to the memory cell to a target level during a first period and maintains the cell power supply voltage at the target level during a second period succeeding the first period. The write assist circuit 760 may include a precharge circuit 120 in FIG. 1 for precharging the internal voltage line. The bitline precharge circuit 770 is connected to the bitline BL1 and the complementary bitline BLB1 for precharging the bitline BL1 and the complementary bitline BLB1. Although not illustrated, it will be understood that the write assist circuit 760 is connected to the respective bitlines pairs (BL1~BLn) and (BLB1~BLBn).

Figure 16:
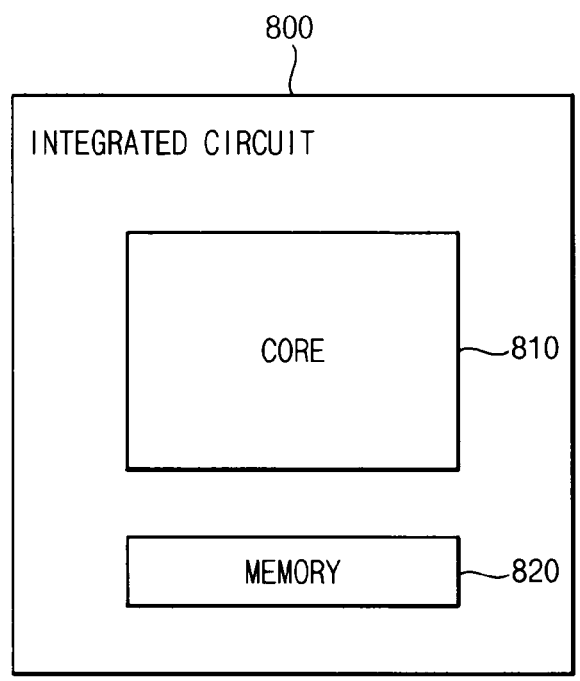
FIG. 16 is a block diagram illustrating an integrated circuit including a semiconductor memory device according to exemplary embodiments.

FIG. 16 is a block diagram illustrating an integrated circuit including a semiconductor memory device according to exemplary embodiments.

Referring to FIG. 16, an integrated circuit 800 includes a core 810 and a semiconductor memory device 820. For example, the integrated circuit 800 may be an application processor (AP), a microprocessor, a central processing unit (CPU), an application-specific integrated circuit (ASIC), or the like.

For example, the core 810 may be a logic core that performs a predetermined logic operation, or may be a processor core that fetches an instruction or data and processes the fetched instruction or the fetched data. The core 810 may use the semiconductor memory device 820 as a cache memory. For example, the core 810 may temporarily store an instruction or data provided from an external memory device (not shown) in the semiconductor memory device 820.

The semiconductor memory device 820 includes a write assist circuit and lowers the cell power supply voltage during the write operation. The semiconductor memory device 820 lowers the cell power supply voltage of the internal voltage line connected to the memory cell to a target level during a first period and maintains the cell power supply voltage at the target level during a second period succeeding the first period. Accordingly, the semiconductor memory device 820 may perform a write operation on the memory cell stably.

Figure 17:
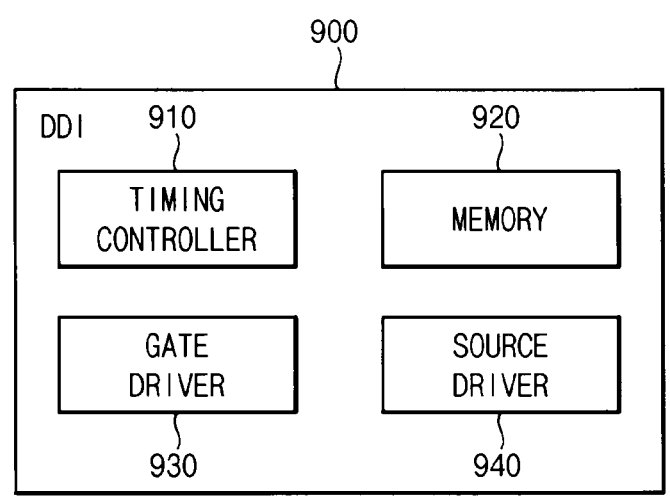
FIG. 17 is a block diagram illustrating a display driver integrated circuit including a semiconductor memory device according to exemplary embodiments.

FIG. 17 is a block diagram illustrating a display driver integrated circuit including a semiconductor memory device according to exemplary embodiments.

Referring to FIG. 17, a display driver integrated circuit 900 includes a timing controller 910, a semiconductor memory device 920, a gate driver 930 and a source driver 940.

The timing controller 910 may control operations of the gate driver 930 and the source driver 940 in response to a timing signal received from an external host (not shown). The semiconductor memory device 920 may store image data provided from the external host on a frame basis or on a line basis. The gate driver 930 may turn on pixel transistors (e.g., thin-film transistors (TFTs)) included in a display panel (not shown), and the source driver 440 may apply a data voltage to pixels included in the display panel based on the image data stored in the semiconductor memory device 920.

The semiconductor memory device 920 includes a write assist circuit and lowers the cell power supply voltage during the write operation. The semiconductor memory device 920 lowers the cell power supply voltage of the internal voltage line connected to the memory cell to a target level during a first period and maintains the cell power supply voltage at the target level during a second period succeeding the first period. Accordingly, the semiconductor memory device 920 may perform a write operation on the memory cell stably.

Figure 18:
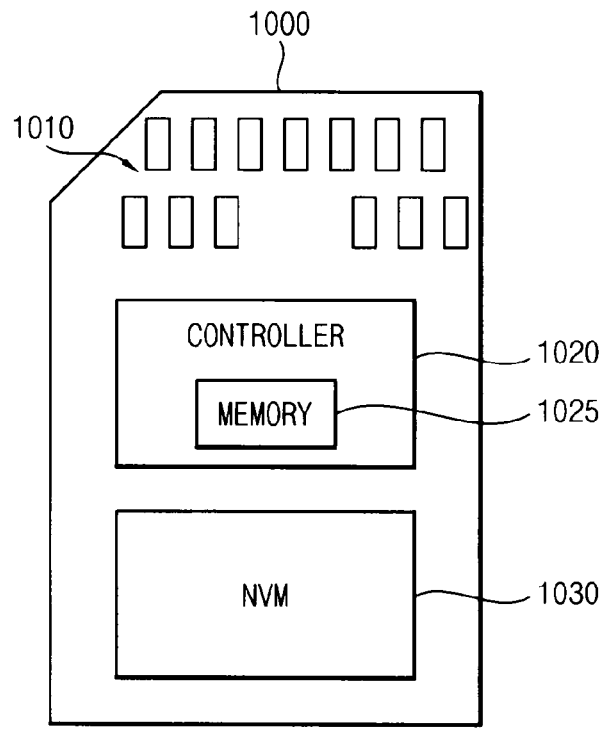
FIG. 18 is a block diagram illustrating a memory card according to exemplary embodiments.

FIG. 18 is a block diagram illustrating a memory card according to exemplary embodiments.

Referring to FIG. 18, a memory card 1000 includes a plurality of connection pins 1010, a controller 1020, a semiconductor memory device 1025 and a nonvolatile memory device 1030. According to exemplary embodiments, the memory card 1000 may be any memory card, such as a multimedia card (MMC), a secure digital (SD) card, a micro-SD card, a memory stick, an identification (ID) card, a personal computer memory card international association (PC-MCIA) card, a chip card, a universal serial bus (USB) card, a smart card, a compact flash (CF) card, an embedded multimedia card (eMMC), a hybrid embedded multimedia card (hybrid eMMC), etc.

The plurality of connection pins 1010 may be coupled to an external host (not shown) to transmit/receive signals between the external host and the memory card 1000. The plurality of connection pins 1010 may include a clock pin, a command pin, a data pin and/or a reset pin. According to exemplary embodiments, the memory card 1000 may be attached to any computing system, such as a mobile phone, a smart phone, a personal digital assistant (PDA), a portable multimedia player (PMP), a digital camera, a music player, a portable game console, a navigation device, a personal computer (PC), a server computer, a workstation, a tablet computer, a laptop computer, a digital television, a set-top box, etc.

The controller 1020 may receive data from the external host, and may control the nonvolatile memory device 1030 to store the received data. Further, the controller 1020 may control the nonvolatile memory device 1030 to provide the stored data to the external host. The controller 1020 may include the semiconductor memory device 1025 as a buffer memory to temporarily store the data transferred between the external host and the nonvolatile memory device 1030. In some embodiments, the semiconductor memory device 1025 may store an address translation table for managing blocks of the nonvolatile memory device 1030.

The semiconductor memory device 1025 includes a write assist circuit and lowers the cell power supply voltage during the write operation. The semiconductor memory device 1025 lowers the cell power supply voltage of the internal voltage line connected to the memory cell to a target level during a first period and maintains the cell power supply voltage at the target level during a second period succeeding the first period. Accordingly, the semiconductor memory device 1025 may perform a write operation on the memory cell stably.

Figure 19:
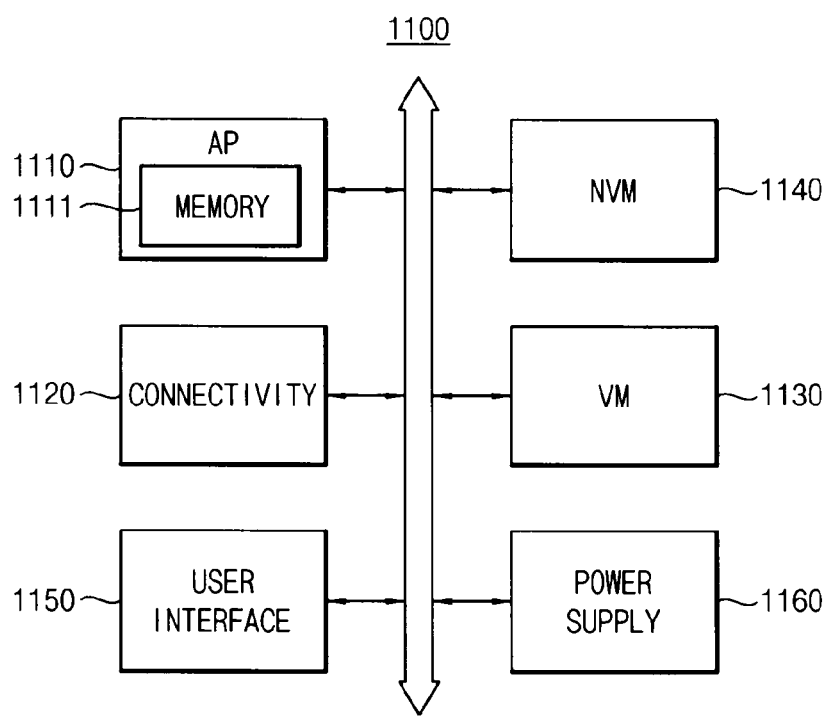
FIG. 19 is a block diagram illustrating a mobile system according to exemplary embodiments.

FIG. 19 is a block diagram illustrating a mobile system according to exemplary embodiments.

Referring to FIG. 19, a mobile system 1100 includes an application processor 1110, a connectivity unit 1120, a volatile memory device 1130, a nonvolatile memory device 1140, a user interface 1150 and a power supply 1160. According to exemplary embodiments, the mobile system 1100 may be any mobile system, such as a mobile phone, a smart phone, a personal digital assistant (PDA), a portable multimedia player (PMP), a digital camera, a portable game console, a music player, a camcorder, a video player, a navigation system, etc.

The application processor 1110 may execute applications, such as an internet browser, a game application, a video player application, etc. The application processor 1110 may include a semiconductor memory device 1111 as a cache memory to temporarily store an instruction or data from the volatile memory device 1130 or the nonvolatile memory device 640. The semiconductor memory device 1111 includes a write assist circuit and lowers the cell power supply voltage during the write operation. The semiconductor memory device 1111 lowers the cell power supply voltage of the internal voltage line connected to the memory cell to a target level during a first period and maintains the cell power supply voltage at the target level during a second period succeeding the first period. Accordingly, the semiconductor memory device 1111 may perform a write operation on the memory cell stably. According to exemplary embodiments, the application processor 1110 may include one processor core or multiple processor cores. For example, the application processor 1110 may be a multi-core processor, such as a dual-core processor, a quad-core processor, a hexa-core processor, etc.

The connectivity unit 1120 may communicate with an external device. For example, the connectivity unit 1120 may perform a USB communication, an Ethernet communication, a near field communication (NFC), a radio frequency identification (RFID) communication, a mobile telecommunication, a memory card communication, etc.

The volatile memory device 1130 may store data processed by the application processor 1110, or may serve as a working memory. For example, the volatile memory device 1130 may be implemented by a dynamic random access memory (DRAM), a static random access memory (SRAM), a mobile DRAM, or the like.

The nonvolatile memory device 1140 may store a boot image for booting the mobile system 1100. For example, the nonvolatile memory device 1140 may be implemented by an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like.

The user interface 1150 may include at least one input device, such as a keypad, a touch screen, etc., and at least one output device, such as a display device, a speaker, etc. The power supply 1160 may supply the mobile system 1100 with power. In some embodiments, the mobile system 1100 may further include a camera image processor (CIS), and a modem, such as a baseband chipset. For example, the modem may be a modem processor that supports at least one of various communications, such as GSM, GPRS, WCDMA, HSxPA, etc.

According to exemplary embodiments, the mobile system 1100 and/or components of the mobile system 1100 may be packaged in various forms, such as package-on-package (PoP), ball-grid-arrays (BGAs), chip-scale packages (CSPs), plastic leaded chip carrier (PLCC), plastic dual in-line package (PDIP), die-in-waffle-pack, die-in-wafer-form, chip-on-board (COB), ceramic dual in-line package (CERDIP), plastic metric-quad-flat-pack (MQFP), thin-quad-flat-pack (TQFP), small outline IC (SOIL), shrink small-outline package (SSOP), thin small-outline package (TSOP), system-in-package (SIP), multi-chip package (MCP), wafer-level fabricated package (WFP), or wafer-level processed stack package (VVSP).

Figure 20:
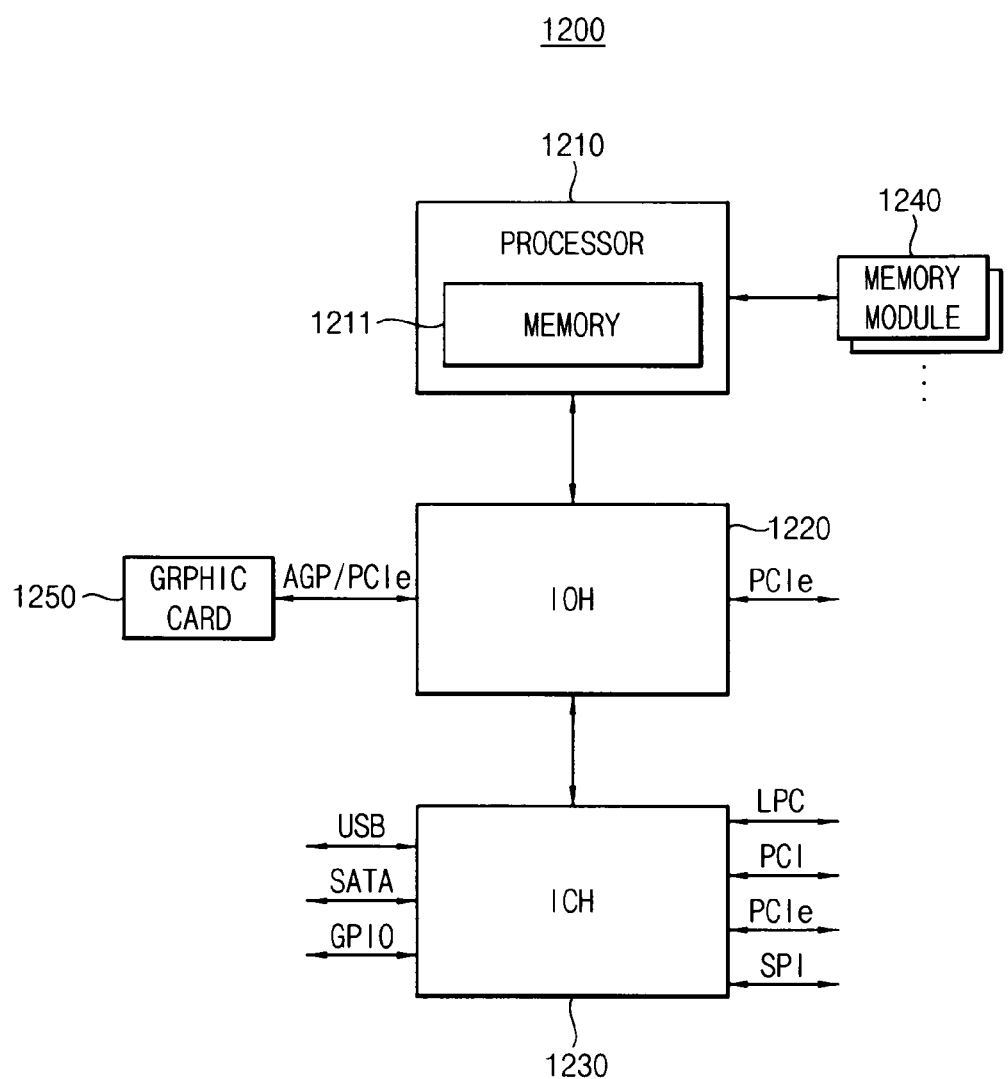
FIG. 20 is a block diagram illustrating a computing system according to exemplary embodiments.

FIG. 20 is a block diagram illustrating a computing system according to exemplary embodiments.

Referring to FIG. 20, a computing system 1200 includes a processor 1210, an input/output hub 1220, an input/output controller hub 1230, at least one memory module 1240 and a graphic card 1250. According to exemplary embodiments, the computing system 1200 may be any computing system, such as a personal computer (PC), a server computer, a workstation, a tablet computer, a laptop computer, a mobile phone, a smart phone, a personal digital assistant (PDA), a portable multimedia player (PMP), a digital camera, a digital television, a set-top box, a music player, a portable game console, a navigation device, etc.

The processor 1210 may perform specific calculations or tasks. For example, the processor 1210 may be a microprocessor, a central process unit (CPU), a digital signal processor, or the like. The processor 1210 may include a semiconductor memory device 1211 as a cache memory to temporarily store an instruction or data from the memory module 1240. The semiconductor memory device 1211 includes a write assist circuit and lowers the cell power supply voltage during the write operation. The semiconductor memory device 1211 lowers the cell power supply voltage of the internal voltage line connected to the memory cell to a target level during a first period and maintains the cell power supply voltage at the target level during a second period succeeding the first period. Accordingly, the semiconductor memory device 1211 may perform a write operation on the memory cell stably. According to exemplary embodiments, the processor 1210 may include one processor core or multiple processor cores. For example, the processor 1210 may be a multi-core processor, such as a dual-core processor, a quad-core processor, a hexa-core processor, etc. Although FIG. 12 illustrates an example of the computing system 1200 including one processor 1210, the computing system 1200 according to exemplary embodiments may include one or more processors.

The processor 1210 may include a memory controller (not shown) that controls an operation of the memory module 1240. The memory controller included in the processor 1210 may be referred to as an integrated memory controller (IMC). A memory interface between the memory module 1240 and the memory controller may be implemented by one channel including a plurality of signal lines, or by a plurality of channels. Each channel may be coupled to at least one memory module 1240. In some embodiments, the memory controller may be included in the input/output hub 1220. The input/output hub 1220 including the memory controller may be referred to as a memory controller hub (MCH).

The input/output hub 1220 may manage data transfer between the processor 1210 and devices, such as the graphic card 1250. The input/output hub 1220 may be coupled to the processor 1210 via one of various interfaces, such as a front side bus (FSB), a system bus, a HyperTransport, a lightning data transport (LDT), a QuickPath interconnect (QPI), a common system interface (CSI), etc. Although FIG. 20 illustrates an example of the computing system 700 including one input/ output hub 1220, according to exemplary embodiments, the computing system 700 may include a plurality of input/output hubs.

The input/output hub 1220 may provide various interfaces with devices. For example, the input/output hub 1220 may provide an accelerated graphics port (AGP) interface, a peripheral component interface-express (PCIe), a communications streaming architecture (CSA) interface, etc.

The graphic card 1250 may be coupled to the input/output hub 1220 via the AGP or the PCIe. The graphic card 1250 may control a display device (not shown) for displaying an image. The graphic card 1250 may include an internal processor and an internal memory to process the image. In some embodiments, the input/output hub 1220 may include an internal graphic device along with or instead of the graphic card 1250. The internal graphic device may be referred to as an integrated graphics, and an input/output hub including the memory controller and the internal graphic device may be referred to as a graphics and memory controller hub (GMCH).

The input/output controller hub 1230 may perform data buffering and interface arbitration to efficiently operate various system interfaces. The input/output controller hub 1230 may be coupled to the input/output hub 1220 via an internal bus. For example, the input/output controller hub 1230 may be coupled to the input/output hub 1220 via one of various interfaces, such as a direct media interface (DMI), a hub interface, an enterprise Southbridge interface (ESI), PCIe, etc. The input/output controller hub 1230 may provide various interfaces with peripheral devices. For example, the input/output controller hub 1230 may provide a universal serial bus (USB) port, a serial advanced technology attachment (SATA) port, a general purpose input/output (GPIO), a low pin count (LPC) bus, a serial peripheral interface (SPI), a PCI, a PCIe, etc.

In some embodiments, the processor 1210, the input/output hub 1220 and the input/output controller hub 1230 may be implemented as separate chipsets or separate integrated circuits. In other embodiments, at least two of the processor 1210, the input/output hub 1220 and the input/output controller hub 1230 may be implemented as one chipset.

The exemplary embodiments may be applicable to any kind of semiconductor memory device and/or system including the same. For example, the exemplary embodiments may be applicable to a mobile phone, a smart phone, a personal digital assistant (PDA), a portable multimedia player (PMP), a digital camera, a portable game console, a music player, a camcorder, a video player, a navigation system, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A semiconductor memory device comprising:
    at least one memory cell connected to an internal voltage line that receives a cell power supply voltage;
    a write assist circuit connected to the internal voltage line, the write assist circuit configured to lower a level of the cell power supply voltage to a target level during a first period of a write operation on the memory cell and configured to maintain the level of the cell power supply voltage at the target level during a second period of the write operation based on a write assist control signal, the second period succeeding the first period; and
    a precharge circuit connected between a power supply voltage and the internal voltage line, the precharge circuit configured to precharge the internal voltage line.

2. The semiconductor memory device of claim 1, wherein the first period is shorter than the second period.

3. The semiconductor memory device of claim 1, wherein the write assist circuit comprises:
    a first p-channel metal oxide semiconductor (PMOS) transistor, connected between the internal voltage line and a ground voltage, having a gate that receives the write assist control signal, the first PMOS transistor providing a first pull-down path between the internal voltage line and the ground voltage;
    an accelerator, connected between the internal voltage line and the ground voltage in parallel with the first PMOS transistor, the accelerator configured to be enabled during the first period, configured to be disabled during the second period, and configured to provide a second pull-down path between the internal voltage line and the ground voltage in response to a pulse signal; and
    a pulse generator configured to generate the pulse signal based on the write assist control signal.

4. The semiconductor memory device of claim 3, wherein the accelerator comprises a second PMOS transistor connected between the internal voltage line and the ground voltage, the second PMOS transistor having a gate which receives the pulse signal, and wherein a current driving capability of the second PMOS transistor is greater than a current driving capability of the first PMOS transistor.

5. The semiconductor memory device of claim 3, wherein the accelerator comprises a n-channel metal oxide semiconductor (NMOS) transistor connected between the internal voltage line and the ground voltage, the NMOS transistor having a gate which receives the pulse signal, and wherein a current driving capability of the NMOS transistor is greater than a current driving capability of the first PMOS transistor.

6. The semiconductor memory device of claim 1, wherein the precharge circuit comprises:
    a first PMOS transistor connected between the power supply voltage and the internal voltage line, the first PMOS transistor having a gate connected to the ground voltage.

7. The semiconductor memory device of claim 3, wherein the first PMOS transistor and the accelerator are turned on to lower the level of the cell power supply voltage to the target level during the first period and the first PMOS transistor remains turned on and the accelerator is turned off such that the first and the second PMOS transistors maintain the level of the cell power supply voltage at the target level during the second period.

8. The semiconductor memory device of claim 3, wherein the first and second pull-down paths are conducting such that the cell power supply voltage is lowered to the target level during the first period, and wherein the first pull-down path is conducting and the second pull-down path is not conducting such that the cell power supply voltage is maintained at the target level during the second period.

9. The semiconductor memory device of claim 1, wherein the write assist circuit comprises:

a first PMOS transistor, connected between the internal voltage line and a ground voltage, having a gate that receives the write assist control signal;

a second PMOS transistor, connected to the internal voltage line, having a gate that receives the write assist control signal;

an NMOS transistor, connected between the second PMOS transistor and a ground voltage, which is turned on during the first period and is turned off during the second period in response to a delayed pulse signal having a delayed and inverted phase with respect to the write assist control signal; and a pulse generator configured to generate the delayed pulse signal in response to the write assist control signal.

10. The semiconductor memory device of claim 9, wherein the pulse generator comprises an odd number of inverters that are connected in series.

11. The semiconductor memory device of claim 1, wherein the write assist circuit comprises:

a first PMOS transistor, connected between the internal voltage line and a ground voltage, having a gate that receives the write assist control signal;

a second PMOS transistor, connected to the internal voltage line, having a gate that receives the write assist control signal;

a third PMOS transistor, connected between the second PMOS transistor and a ground voltage, which is turned on during the first period and is turned off during the second period in response to a delayed pulse signal having a delayed and inverted phase with respect to the write assist control signal; and a pulse generator configured to generate the delayed pulse signal in response to the write assist control signal.

12. The semiconductor memory device of claim 11, wherein the pulse generator comprises an even number of inverters that are connected in series.

13. A semiconductor memory device comprising:

at least one memory cell connected to an internal voltage line that receives a cell power supply voltage; and a write assist circuit connected to the internal voltage line, the write assist circuit configured to lower a level of the cell power supply voltage to a target level during a first period of a write operation to the memory cell and configured to maintain the level of the cell power supply voltage at the target level during a second period of the write operation based on a write assist control signal and a delay control signal, wherein the write assist circuit comprises:

a first pull-down unit configured to be turned on during the first and second periods in response to the write assist control signal to provide a first pull-down path from the internal voltage line to a ground voltage; and a second pull-down unit configured to be turned on during the first period and configured to be turned off during the second period in response to the delay control signal to provide a second pull-down path from the internal voltage line to the ground voltage.

14. The semiconductor memory device of claim 13, wherein the second period succeeds the first period and the second period is longer than the first period.

15. The semiconductor memory device of claim 13, further comprising:

a precharge circuit connected between a power supply voltage and the internal voltage line, the precharge circuit configured to precharge the internal voltage line.

16. The semiconductor memory device of claim 15, wherein the precharge circuit comprises:

a first PMOS transistor connected between the power supply voltage and the internal voltage line, the first PMOS transistor having a gate connected to the ground voltage; and a second PMOS transistor connected in parallel with the first PMOS transistor between the power supply voltage and the internal voltage line, the second PMOS transistor having a gate that receives the write assist control signal.

17. The semiconductor memory device of claim 15, wherein the precharge circuit comprises:

a first PMOS transistor connected between the power supply voltage and the internal voltage line, the second PMOS transistor having a gate connected to the ground voltage;

a second PMOS transistor connected in parallel with the first PMOS transistor between the power supply voltage and the internal voltage line, the second PMOS transistor having a gate that receives the write assist control signal; and a third PMOS transistor connected in parallel with the first and second PMOS transistors between the power supply voltage and the internal voltage line, the third PMOS transistor having a gate that receives the delay control signal.

18. A memory card, comprising:

a nonvolatile memory device;

a semiconductor memory device, comprising:

at least one memory cell connected to an internal voltage line that receives a cell power supply voltage, and a write assist circuit connected to the internal voltage line, the write assist circuit configured to lower a level of the cell power supply voltage to a target level during a first period of a write operation on the memory cell by enabling a first pull-down path from the internal voltage line and a second pull-down path from the internal voltage line and configured to maintain the level of the cell power supply voltage at the target level during a second period of the write operation based on a write assist control signal by enabling the first pull-down path and disabling the second pull-down path; and a controller configured to receive data and control the nonvolatile memory device to store the received data, and configured to control the semiconductor memory device as a buffer to temporarily store the data to be stored in the nonvolatile memory device.

* * * * *